United States Patent
Rice et al.

(10) Patent No.: US 10,595,415 B2
(45) Date of Patent: Mar. 17, 2020

(54) ELECTRONIC DEVICE MANUFACTURING SYSTEM

(71) Applicant: Applied Materials, Inc., Santa Clara, CA (US)

(72) Inventors: Michael Robert Rice, Pleasanton, CA (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 152 days.

(21) Appl. No.: 15/628,134

(22) Filed: Jun. 20, 2017

(65) Prior Publication Data

US 2017/0290166 A1    Oct. 5, 2017

Related U.S. Application Data (62) Division of application No. 14/495,402, filed on Sep. 24, 2014, now Pat. No. 9,717,147.

(Continued)

(51) Int. Cl.
*H05K 3/00* (2006.01)
*H01L 21/67* (2006.01)

(52) U.S. Cl.
CPC ......... *H05K 3/00* (2013.01); *H01L 21/67196* (2013.01); *Y10T 29/49117* (2015.01); *Y10T 29/53187* (2015.01)

(58) Field of Classification Search
CPC .............. H01L 21/67196; H05K 3/00; Y10T 29/49117; Y10T 29/53187
See application file for complete search history.

(56) References Cited

U.S. PATENT DOCUMENTS 5,751,003 A    5/1998  Rose et al.
5,951,770 A    9/1999  Perlov et al.
(Continued)

FOREIGN PATENT DOCUMENTS

EP    1975997 A2    10/2008
JP    2005-175440 A    6/2005
(Continued)

OTHER PUBLICATIONS

Taiwan Search Report of Taiwan Application No. 103133255 dated Jan. 3, 2018.

(Continued)

*Primary Examiner* — Minh N Trinh
(74) *Attorney, Agent, or Firm* — Lowenstein Sandler LLP (57) ABSTRACT

An electronic device manufacturing system may include a mainframe to which one or more process chambers of different size may be coupled. A different number of process chambers may be coupled to each facet (i.e., side wall) of the mainframe. The process chambers coupled to one facet may be of a different size than process chambers coupled to other facets. For example, one process chamber of a first size may be coupled to a first facet, two process chambers each of a second size different than the first size may be coupled to a second facet, and three process chambers each of a third size different than the first and second sizes may be coupled to a third facet. Other configurations are possible. The mainframe may have a square or rectangular shape. Methods of assembling an electronic device manufacturing system are also provided, as are other aspects.

20 Claims, 4 Drawing Sheets

Related U.S. Application Data (60) Provisional application No. 61/882,795, filed on Sep. 26, 2013.

(56) References Cited

U.S. PATENT DOCUMENTS

| | | | |
|---|---|---|---|
| 6,287,386 | B1 | 9/2001 | Perlov et al. |
| 6,468,353 | B1 | 10/2002 | Perlov et al. |
| 6,575,737 | B1 | 6/2003 | Perlov et al. |
| 6,916,397 | B2 | 7/2005 | Pfeiffer et al. |
| 7,207,766 | B2 | 4/2007 | Kurita et al. |
| 7,624,772 | B2 | 12/2009 | Iwabuchi |
| 7,651,315 | B2 | 1/2010 | Kurita et al. |
| 7,720,655 | B2 | 5/2010 | Rice |
| 8,196,619 | B2 | 6/2012 | Iwabuchi |
| 9,717,147 | B2 * | 7/2017 | Rice ............... H01L 21/67196 |
| 2002/0005168 | A1 | 1/2002 | Kraus et al. |
| 2004/0020601 | A1 | 2/2004 | Zhao |
| 2005/0072716 | A1 | 4/2005 | Quiles et al. |
| 2005/0095088 | A1 | 5/2005 | Kurita et al. |
| 2006/0130747 | A1 | 6/2006 | Ishikawa |
| 2006/0231027 | A1 | 10/2006 | Iwabuchi |
| 2007/0140814 | A1 | 6/2007 | Kurita et al. |
| 2008/0202892 | A1 | 8/2008 | Smith et al. |
| 2008/0276867 | A1 | 11/2008 | Schaller |
| 2009/0108544 | A1 | 4/2009 | Sico et al. |
| 2010/0040437 | A1 | 2/2010 | Iwabuchi |
| 2013/0039734 | A1 | 2/2013 | Englhardt et al. |
| 2014/0262036 | A1 * | 9/2014 | Reuter ............... H01L 21/6719 156/345.31 |
| 2014/0263165 | A1 | 9/2014 | Hongkham et al. |
| 2014/0271055 | A1 * | 9/2014 | Weaver ............ H01L 21/67161 414/221 |
| 2014/0273487 | A1 | 9/2014 | Deshmukh et al. |
| 2015/0013910 | A1 | 1/2015 | Krupyshev et al. |
| 2015/0082625 | A1 | 3/2015 | Rice et al. |
| 2015/0311102 | A1 * | 10/2015 | Weiss ............... H01L 21/67126 414/222.01 |
| 2016/0007412 | A1 | 1/2016 | Busche et al. |
| 2016/0329234 | A1 | 11/2016 | Krupyshev et al. |

FOREIGN PATENT DOCUMENTS

| | | |
|---|---|---|
| JP | 2006-303013 A | 11/2006 |
| JP | 2008-252012 A | 10/2008 |
| JP | 2010-074073 A | 4/2010 |
| JP | 2015-508236 A | 3/2015 |
| KR | 10-2008-0102681 | 11/2008 |
| KR | 10-2013-0020203 | 2/2013 |
| WO | 9730465 A1 | 8/1997 |
| WO | WO 2012-090395 | 7/2012 |
| WO | WO 2013-120054 | 8/2013 |

OTHER PUBLICATIONS

Perlov et al., U.S. Appl. No. 10/193,605, titled: "Method and Apparatus for Improved Substrate Handling", filed Jul. 11, 2002.
Quiles et al, U.S. Appl. No. 14/335,415, titled: "Substrate Processing System, Valve Assembly, and Processing Method," filed Jul. 18, 2014.
Parkhe et al., U.S. Appl. No. 14/085,026, titled: "Electrostatic Chuck With Variable Pixilated Heating," filed Nov. 20, 2013.
Madiwal et al., U.S. Appl. No. 14/036,754, titled: "Gas Apparatus, Systems, and Methods for Chamber Ports," filed Sep. 25, 2013.
Koshti et al., U.S. Appl. No. 14/456,631, titled: "Substrate Processing Systems, Apparatus, and Methods with Factory Interface Environmental Controls," filed Aug. 11, 2014.
Busche et al., U.S. Appl. No. 14/299,850, titled: "Substrate Temperature Control Apparatus Including Optical Fiber Heating, Substrate Temperature Control Systems, Electronic Device Processing Systems, and Methods," filed Jun. 9, 2014.
Ng et al., U.S. Appl. No. 14/498,449, titled: "Transfer Chamber Gas Purge Apparatus, Electronic Device Processing Systems, and Purge Methods," filed Sep. 26, 2014.
International Search Report and Written Opinion of International Application No. PCT/US2014/057233 dated Dec. 23, 2014.
International Preliminary Report on Patentability of International Application No. PCT/US2014/057233 dated Apr. 7, 2016.
Restriction Requirement of U.S. Appl. No. 14/495,402 dated Jun. 14, 2016.
Aug. 15, 2016 Reply to Jun. 14, 2016 Restriction Requirement of U.S. Appl. No. 14/495,402.
Non-Final Office Action of U.S. Appl. No. 14/495,402 dated Sep. 29, 2016.
Dec. 20, 2016 Reply to Sep. 29, 2016 Non-Final Office Action of U.S. Appl. No. 14/495,402.
Applicant-Initiated Interview Summary of U.S. Appl. No. 14/495,402 dated Dec. 23, 2016.
Notice of allowance of U.S. Appl. No. 14/495,402 dated Mar. 20, 2017.
Chinese Search Report of Chinese Application No. 201480052802.5 dated May 11, 2017.
Chinese Search Report of Chinese Application No. 201480052802.5 dated Jan. 24, 2018.
Taiwan Search Report of Taiwan Application No. 107118850 dated Oct. 8, 2018.

* cited by examiner

ELECTRONIC DEVICE MANUFACTURING SYSTEM

RELATED APPLICATION

This application is a divisional application of, and claims priority to and the benefit of, U.S. patent application Ser. No. 14/495,402 filed on Sep. 24, 2014, issued as U.S. Pat. No. 9,717,147, and titled "MIXED-PLATFORM APPARATUS, SYSTEMS, AND METHODS FOR SUBSTRATE PROCESSING", which claims priority to and the benefit of U.S. Provisional Patent Application No. 61/882,795, filed Sep. 26, 2013, and entitled "MIXED-PLATFORM APPARATUS, SYSTEMS, AND METHODS FOR SUBSTRATE PROCESSING", each of which is hereby incorporated by reference herein in its entirety for all purposes.

FIELD

The invention relates generally to electronic device manufacturing, and more particularly to mixed-platform apparatus, systems, and methods for substrate processing.

BACKGROUND

Conventional electronic device manufacturing systems may include a mainframe around which multiple process chambers and load lock chambers are arranged. The mainframe may have a number of side walls (commonly referred to as "facets") to which a typically equal number of generally equally-sized process chambers and/or load lock chambers are coupled. For example, a mainframe may have four facets wherein a first facet may have two load lock chambers coupled thereto and each of the other three facets may have two process chambers of generally equal size coupled thereto. Such mainframe configurations are typically provided to allow various process chambers and/or load lock chambers to be selectively and interchangeably arranged around a mainframe. However, the types and sequences of substrate processing that may be performed in an electronic device manufacturing system may be limited by such mainframe configurations.

Accordingly, apparatus, systems, and methods are needed to provide other substrate processing mainframe configurations.

SUMMARY

According to a first aspect, an electronic device manufacturing system is provided. The electronic device manufacturing system comprises a mainframe comprising a transfer chamber and a plurality of facets defining side walls of the transfer chamber, each of the plurality of facets configured to couple to one or more process chambers or load lock chambers, each one of the plurality of facets having one or more substrate access ports, wherein a first one of the plurality of facets has a first number of substrate access ports, and a second one of the plurality of facets has a second number of substrate access ports, the second number different than the first number.

According to a second aspect, another electronic device manufacturing system is provided. The electronic device manufacturing system comprises a mainframe comprising a transfer chamber and a plurality of facets defining side walls of the transfer chamber, a first process chamber coupled to a first one of the plurality of facets, the first process chamber having a first facet-side dimension, and a second process chamber coupled to a second one of the plurality of facets, the second process chamber having a second facet-side dimension different than the first facet-side dimension.

According to a third aspect, a method of assembling an electronic device manufacturing system is provided. The method comprises providing a mainframe comprising a transfer chamber and a plurality of facets defining side walls of the transfer chamber, coupling a first chamber to a first one of the plurality of facets, the first chamber having a first facet-side dimension, and coupling a second chamber to a second one of the plurality of facets, the second chamber having a second facet-side dimension different than the first facet-side dimension.

Still other aspects, features, and advantages of embodiments of the invention may be readily apparent from the following detailed description wherein a number of example embodiments and implementations are described and illustrated, including the best mode contemplated for carrying out the invention. The invention may also include other and different embodiments, and its several details may be modified in various respects, all without departing from the scope of the invention. Accordingly, the drawings and descriptions are to be regarded as illustrative in nature, and not as restrictive. The invention covers all modifications, equivalents, and alternatives falling within the scope of the invention.

BRIEF DESCRIPTION OF DRAWINGS

The drawings, described below, are for illustrative purposes only and are not necessarily drawn to scale. The drawings are not intended to limit the scope of this disclosure in any way.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts.

In one aspect, an electronic device manufacturing system may include a mainframe having a transfer chamber and a number of facets that define the side walls of the transfer chamber. In some embodiments, the mainframe may have a square or rectangular shape. One or more load lock chambers may be coupled to one facet of the mainframe, while one or more process chambers may be coupled to each of the other facets of the mainframe. The process chambers may perform various substrate processes, and the process chambers coupled to different facets need not be the same size. Also, each mainframe facet may not be configured to couple to an equal number of process and/or load lock chambers. For example, one facet may be configured to couple to only one process chamber of a first size, a second facet may be configured to couple to two process chambers each of a second size different than the first size, and so on. One or more substrate access ports on each facet may interface each of the load lock and process chambers with the transfer chamber to allow substrates to be transferred there between. The substrate access ports may be sized and positioned on each facet to accommodate the number and size of chambers that may be coupled to each facet. Electronic device manufacturing systems having such a mainframe may allow a wider variety and more diverse sequences of substrate processes to be performed in a single system, thus improving versatility, capability, and/or efficiency of such electronic device manufacturing systems. In other aspects, methods of assembling an electronic device manufacturing system are provided, as will be explained in greater detail below in connection with FIGS. 1-4.

Figure 1:
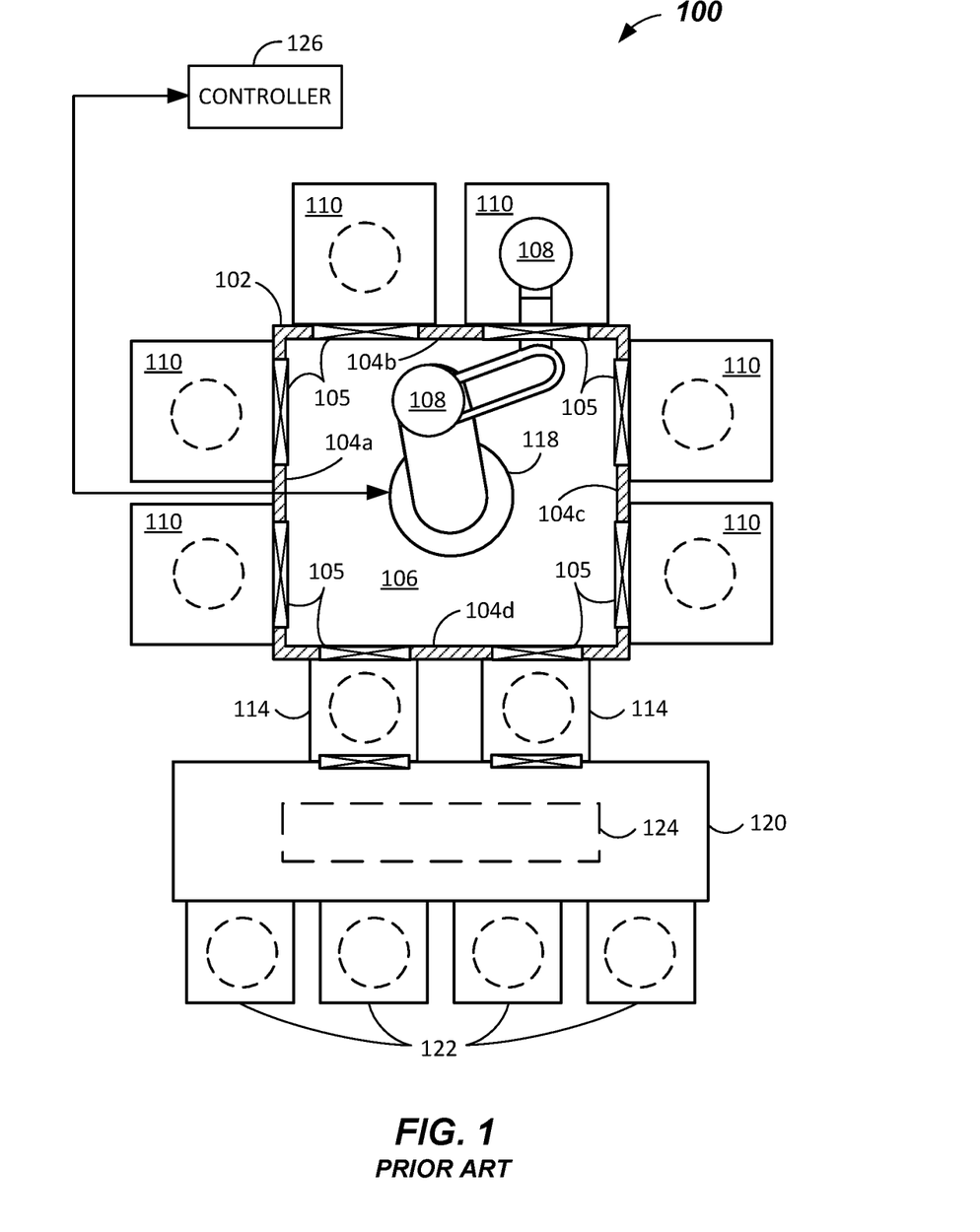
FIG. 1 illustrates a schematic top view of an electronic device manufacturing system according to the prior art.

FIG. 1 illustrates an example of a known electronic device manufacturing system 100 in accordance with the prior art. Electronic device manufacturing system 100 is configured to process substrates and may include a mainframe 102 having four facets 104a-d. Mainframe 102 may include a transfer chamber 106 wherein facets 104a-d may define the side walls of transfer chamber 106. Each of facets 104a-d may have a pair of substrate access ports 105 each configured to allow a horizontally-oriented substrate 108 to pass there through. Substrate 108 may be a semiconductor wafer, glass plate or panel, and/or other workpiece used to make electronic devices or circuit components. Each substrate access port 105 may be, e.g., an elongated slot or slit formed in a side wall of transfer chamber 106, and each may include, e.g., a slit valve or other suitable device for opening and closing a substrate access port 105.

Each of facets 104a-d may be coupled to a respective pair of process chambers 110 or load lock chambers 114. Each process chamber 110 and load lock chamber 114 may have a chamber port corresponding to a respective substrate access port 105. Transfer chamber 106, process chambers 110, and/or load lock chambers 114 may each operate at a vacuum pressure. Process chambers 110 may each perform a same or different process on a substrate 108 including, e.g., deposition, oxidation, nitration, etching, polishing, cleaning, lithography, or the like. Other processes may be performed therein.

Mainframe 102 may also include a robot assembly 118 in transfer chamber 106. Robot assembly 118 may be configured to transfer one or more substrates 108 to and from each process chamber 110 and load lock chamber 114. Load lock chambers 114 may be coupled to a factory interface 120, which may be coupled to one or more FOUPs (front opening unified pods) 122. FOUPs 122 may each be a container having a stationary cassette therein for holding multiple substrates. FOUPs 122 may each have a front opening interface configured to be used with factory interface 120. Factory interface 120 may have a buffer chamber 124 and one or more robot assemblies (not shown) configured to transfer substrates via linear, rotational, and/or vertical movement between FOUPs 122 and load lock chambers 114. Substrates may be transferred between FOUPs 122 and load lock chambers 114 in any sequence or direction. Load lock chambers 114 may each be a batch-type or single substrate-type of load lock chamber. A controller 126 may control robot assembly 118 and/or the operation of electronic device manufacturing system 100.

As shown, mainframe 102 typically has a same number of substantially equally-sized process chambers 110 coupled to facets 104a-c, and typically the same number of load lock chambers 114 coupled to facet 104d as the number of process chambers coupled to each facet 104a-c. Substrate access ports 105 are also typically the same size, and each facet 104a-d typically has the same number of substrate access ports 105. In other known electronic device manufacturing systems, a mainframe may be configured with other equal numbers of chambers coupled to each facet, such as, e.g., three load lock chambers coupled to one facet and three process chambers coupled to each of the other facets. Such known electronic device manufacturing systems having generally symmetric mainframe configurations of load lock chambers and process chambers may be limited as to the types and sequences of substrate processing that may be performed in a single electronic device manufacturing system.

Figure 2:
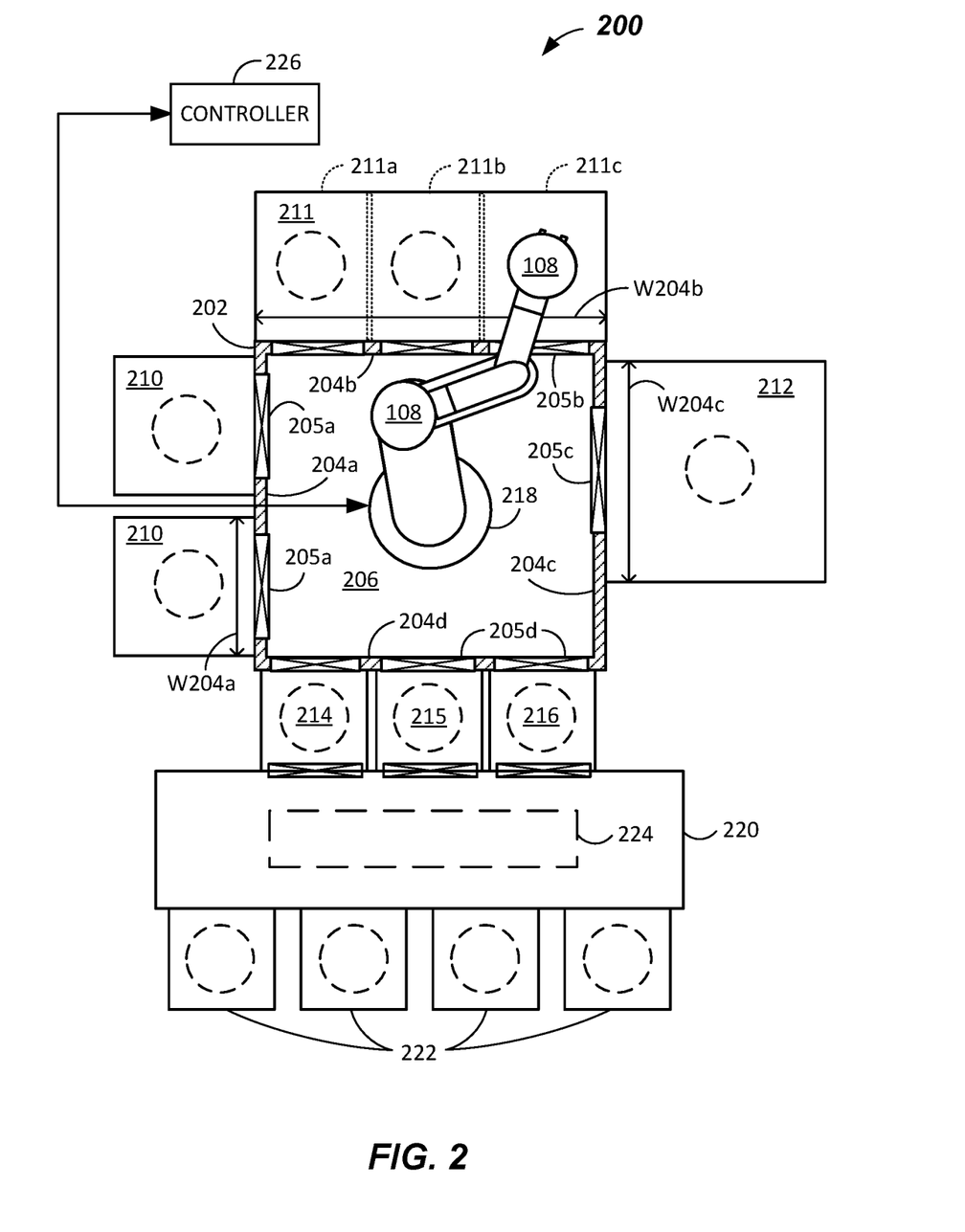
FIG. 2 illustrates a schematic top view of a mixed-platform electronic device manufacturing system according to embodiments.

FIG. 2 illustrates an electronic device manufacturing system 200 in accordance with one or more embodiments. Electronic device manufacturing system 200 may be configured to process multiple substrates 108 concurrently. Electronic device manufacturing system 200 may include a mainframe 202 having four facets 204a-d. Mainframe 202 may include a transfer chamber 206 wherein facets 204a-d may define the side walls of transfer chamber 206. Mainframe 202 may have a generally square or rectangular shape. In other embodiments, mainframe 202 may have other suitable shapes and/or numbers of facets.

In some embodiments, facet 204a may have a pair of substrate access ports 205a, facet 204b may have three substrate access ports 205b (only one is labeled), facet 204c may have one substrate access port 205c, and facet 204d may have three substrate access ports 205d (of which two are labeled). Each of substrate access ports 205a-d is configured to allow a horizontally-oriented substrate 108 to pass there through. Each of substrate access ports 205a-d may be, e.g., an elongated slot or slit formed in a side wall of transfer chamber 206. Substrate access ports 205a-d may each include a slit valve configured to open and close a substrate access port 205a-d. Slit valves may be of any suitable conventional construction, such as, e.g., L-motion slit valves. Other suitable devices may be used for opening and closing substrate access ports 205a-d.

Each of substrate access ports 205a-d may be of a different size. For example, as shown in FIGS. 3A-3D, each substrate access port 205a may have a width W305a, each substrate access port 205b may have a width W305b, and substrate access port 205c may have a width W305c. Width W305a may be different than width W305b, and width W305c may be different than width W305A and different than width W305b. Each substrate access port 205d, labeled 305d1-d6 in FIG. 3D (and described further below in connection with load lock chambers 214, 215, and 216), may each have a width W305d, which may be the same as or different than width W305b. The width of each substrate access port 205a-d is at least wide enough to allow a substrate 108 to pass there through. The different sizes of substrate access ports may allow robot assembly 218 to reach different areas within a chamber coupled to one of facets 204a-d. In some embodiments wherein a facet has two or more substrate access ports, the substrate access ports may not be laterally centered in a facet and/or equidistantly spaced from each other as shown, e.g., in FIGS. 3A and 3B. In some embodiments wherein a facet has a single substrate access port, that substrate access port may be laterally centered in the facet or offset as shown, e.g., in FIGS. 2 and 3C.

In other embodiments, each of facets 204a-d may have other numbers, sizes, and/or combinations of substrate access ports than those shown in FIGS. 2 and 3A-3D, provided the width of a facet is suitable for accommodating those numbers, sizes, and/or combinations of substrate access ports. For example, in some embodiments, facet 204b may have one substrate access port 205c instead of three substrate access ports 205b. In other embodiments, one facet may have one substrate access port 205A and one substrate access port 205b, while another facet may have one substrate access port 205b and one substrate access port 205c. Various combinations of substrate access ports may be possible provided the facet has a suitable width. This allows a mainframe 202 to be customized for coupling to specific types and numbers of desired process and load lock chambers, as now described.

Returning to FIG. 2, each of facets 204a-d may be coupled to one or more process chambers or load lock chambers. Transfer chamber 206 and each process chamber and load lock chamber may operate at a vacuum pressure. In some embodiments, each process chamber may represent a different stage or phase of substrate processing. In other embodiments, two or more process chambers may perform the same process for concurrent substrate processing to improve substrate throughput in electronic device manufacturing system 200.

In some embodiments, facet 204a may be coupled to a pair of process chambers 210, which may be similar or identical to process chambers 110. Process chambers 210 may each be substantially the same size and may each perform a same or different substrate process, such as, e.g., etching, chemical vapor deposition, or physical vapor deposition. Other processes may be performed by one or both of process chambers 210. Process chambers 210 may each have a chamber port corresponding to a respective substrate access port 205a. Process chambers 210 may each have a facet-side dimension that, in some embodiments, may be a width W204a of process chamber 210 (labeled in only one process chamber 210). In some embodiments, width W204a may be, e.g., about 1.2 meters. The facet-side dimension may alternatively be width W305a (FIG. 3A), which may correspond to a chamber port width of process chamber 210.

In some embodiments, facet 204b may be coupled to a process chamber 211. Process chamber 211 may be a three pedestal chamber (that is, may receive up to three substrates 108 for concurrent processing). Process chamber 211 may have three chamber ports corresponding respectively to the three substrate access ports 205b. Process chamber 211 may have a facet-side dimension that, in some embodiments, may be a width W204b of process chamber 211. In some embodiments, width W204b may be, e.g., about 2.4 meters, wherein the width of facet 204b may also be at least about 2.4 meters. The facet-side dimension of process chamber 211 may alternatively be a width W305b (FIG. 3B), which may correspond to a chamber port width of process chamber 211. In some embodiments, process chamber 211 may be a DSM (dielectric systems and modules) chamber. Process chamber 211 may be any other suitable type of process chamber.

In alternative embodiments, facet 204b may be coupled to three process chambers (as illustrated by phantom lines dividing process chamber 211 into three process chambers 211a, 211b, and 211c). In such alternative embodiments, each one of the three process chambers 211a, 211b, and 211c may have a facet-side dimension that may be about one-third of width W204b, which in some embodiments, may be about 800 mm. The facet-side dimension of each process chamber 211a, 211b, and 211c may alternatively be width W305b (FIG. 3B), which may correspond to a chamber port width of process chamber 211a, 211b, and 211c. Each of the three process chambers 211a, 211b, and 211c may perform a same or different substrate process.

In some embodiments, facet 204c may be coupled to a process chamber 212. Process chamber 212 may be larger than process chambers 210 and/or 211 and may have a chamber port corresponding to substrate access port 205c. Process chamber 212 may have a facet-side dimension that, in some embodiments, may be a width W204c of process chamber 212. In some embodiments, width W204c may be greater than about 1.2 meters and less than the width of facet 204c, which in some embodiments may be about 2.4 meters. The facet-side dimension of process chamber 212 may alternatively be a width W305c (FIG. 3B), which may correspond to a chamber port width of process chamber 212. In some embodiments, process chamber 212 may be an epitaxial chamber. In other embodiments, process chamber 212 may be any suitable type of process chamber.

Figure 3A:
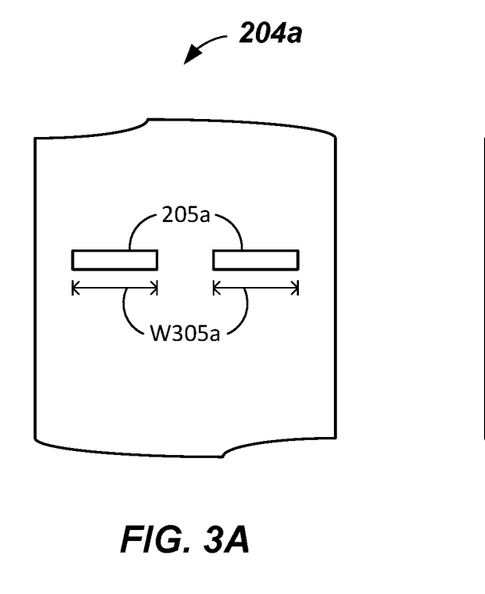
FIGS. 3A-D illustrate simplified, partial, orthographic views of the mainframe facets of FIG. 2 according to embodiments.
Figure 3B:
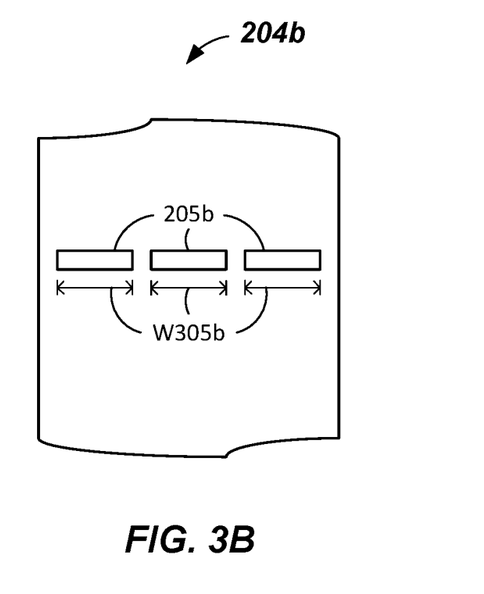
Figure 3C:
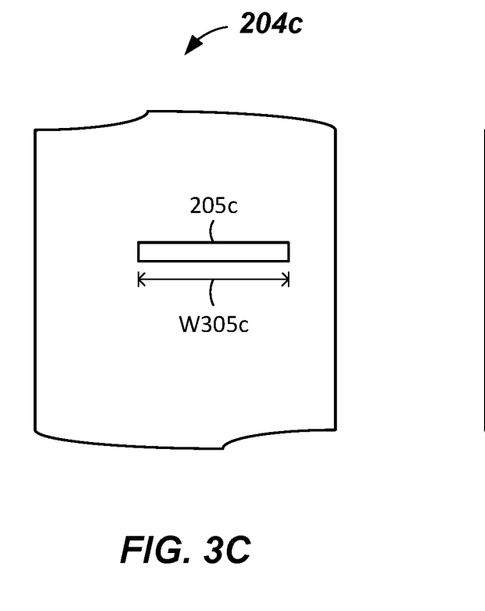
Figure 3D:
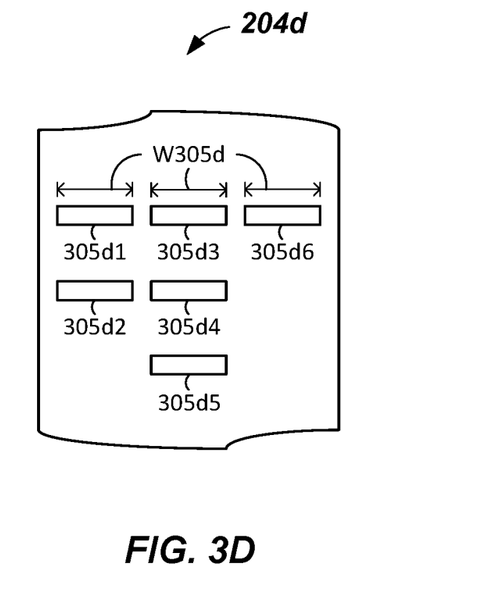

In some embodiments, facet 204d may be coupled to load lock chambers 214, 215, and 216. Load lock chambers 214, 215, and 216 may each be a batch-type or single substrate-type of load lock chamber. In some embodiments, load lock chamber 214 may be a stacked load lock chamber, load lock chamber 215 may be a triple-stacked load lock chamber, and load lock chamber 216 may be a single volume load lock chamber. Each of load lock chambers 214, 215, and 216 may have one or more chamber ports corresponding to a respective substrate access port 205d. For example, as shown in FIG. 3D, stacked load lock chamber 214, which may have two separate substrate volumes, may have two vertically-aligned chamber ports corresponding respectively to substrate access ports 305d1 and 305d2. Triple-stacked load lock chamber 215, which may have three separate substrate volumes, may have three vertically-aligned chamber ports corresponding to substrate access ports 305d3, 305d4, and 305d5, respectively. And single volume load lock chamber 216 may have a single chamber port corresponding to substrate access port 305d6. In other embodiments, any one or more of load lock chambers 214, 215, and/or 216 may be a stacked load lock chamber, a triple-stacked load lock chamber, and/or a single volume load lock chamber. Also, in some embodiments, any one or more of load lock chambers 214, 215, and/or 216 may be a process-capable chamber. That is, any one or more of load lock chambers 214, 215, and/or 216, or any one of the volumes located therein, may be capable of performing a substrate pre-heating, abatement, or cooling process.

Mainframe 202 may also include a robot assembly 218 in transfer chamber 206. Robot assembly 218 may be configured to transfer one or more substrates 108 to and from each process chamber 210, 211 (alternatively 211a-c), and 212 and each load lock chamber 214, 215, and 216. Robot assembly 218 may be configured to transfer substrates 108 from any one chamber directly to any other chamber of mainframe 202. In some embodiments, substrates 108 may be transferred by robot assembly 218 in any sequence or direction. In some embodiments, robot assembly 218 may have dual transport blades each independently projectable and retractable to and from any chamber of mainframe 202, thus increasing system throughput by enabling concurrent substrate transfers. In some embodiments, robot assembly 218 may have only a single transport blade and/or may be a SCARA (selective compliance articulated robot arm) robot. Alternatively, robot assembly 218 may be any suitable mechanism for transferring substrates between the chambers of mainframe 202.

In some embodiments, process chambers 210, 211 (alternatively 211a-c), and 212 may be positioned relative to each other in order to minimize motion of robot assembly 218 and thus transfer time of substrates 108 moving from one chamber to the next. Such positioning may increase substrate throughput and improve yield by reducing the time between subsequent processes and the likelihood of particle contamination during substrate transfers.

Load lock chambers 214, 215, and 216 may be coupled to a factory interface 220 and may provide a first vacuum interface between factory interface 220 and transfer chamber 206. In some embodiments, each of load lock chambers 214, 215, and 216 may increase substrate throughput by alternately communicating with transfer chamber 206 and factory interface 220. That is, while one load lock chamber 214, 215, or 216, or any one volume of a stacked or triple-stacked load lock chamber, communicates with transfer chamber 206, the other load lock chambers 214, 215, or 216, or the other volumes of a stacked or triple-stacked load lock chamber, may communicate with factory interface 220. Substrate transfers between factory interface 220, load lock chambers 214, 215, or 216, and transfer chamber 206 may be made in any other suitable manner.

Factory interface 220 may be coupled to one or more FOUPs (front opening unified pods) 222. FOUPs 222 may each be a container having a stationary cassette therein for holding multiple substrates. FOUPs 222 may each have a front opening interface configured to be used with factory interface 220. In other embodiments, any suitable type of pod and/or load port may be used instead of FOUPs 222. Factory interface 220 may have a buffer chamber 224 and one or more robot assemblies (not shown) configured to transfer substrates via linear, rotational, and/or vertical movement between FOUPs 222 and load lock chambers 214, 215, and 216. Substrates may be transferred between FOUPs 222 and load lock chambers 214, 215, and 216 in any sequence or direction.

Electronic device manufacturing system 200 may have other suitable numbers of FOUPs 222 and/or load lock chambers. In some embodiments, the number of load lock chambers coupled to facet 204d may be independent of the number of process chambers coupled to any one of facets 204a-c. For example, the number of load lock chambers may be different than the highest number of process chambers coupled to a facet. Also, in some embodiments, up to four process chambers may be coupled to a single facet, depending on the size of mainframe 202 relative to the size(s) of the four process chambers. In some embodiments, mainframe 202 may not have a chamber coupled to each chamber position located on facets 204a-d.

A controller 226 may control the processing and transferring of substrates 108 in and through electronic device manufacturing system 200. Controller 226 may be, e.g., a general purpose computer and/or may include a microprocessor or other suitable CPU (central processing unit), a memory for storing software routines that control electronic device manufacturing system 200, input/output peripherals, and support circuits (such as, e.g., power supplies, clock circuits, circuits for driving robot assembly 218, a cache, and/or the like). Controller 226 may be programmed to, e.g., process one or more substrates sequentially through each of process chambers 210, 211 (alternatively 211a-c), and 212. In other embodiments, controller 226 may be programmed to process a substrate in any desired order through process chambers 210, 211 (alternatively 211a-c), and 212. In still other embodiments, controller 226 may be programmed to skip and/or repeat processing of one or more substrates in one or more process chambers 210, 211 (alternatively 211a-c), and 212. Controller 226 may alternatively be programmed to process one or more substrates in electronic device manufacturing system 200 in any suitable manner.

In some embodiments, two electronic device manufacturing systems 200 may be clustered. That is, one facet of each mainframe 202, such as, e.g., a facet 204b of a first mainframe 202 and a facet 204d of a second mainframe 202, may be coupled to the same pass-through chamber for transferring substrates between the two electronic device manufacturing systems 200. This may further enhance the versatility, capability, and/or efficiency of such electronic device manufacturing systems.

Figure 4:
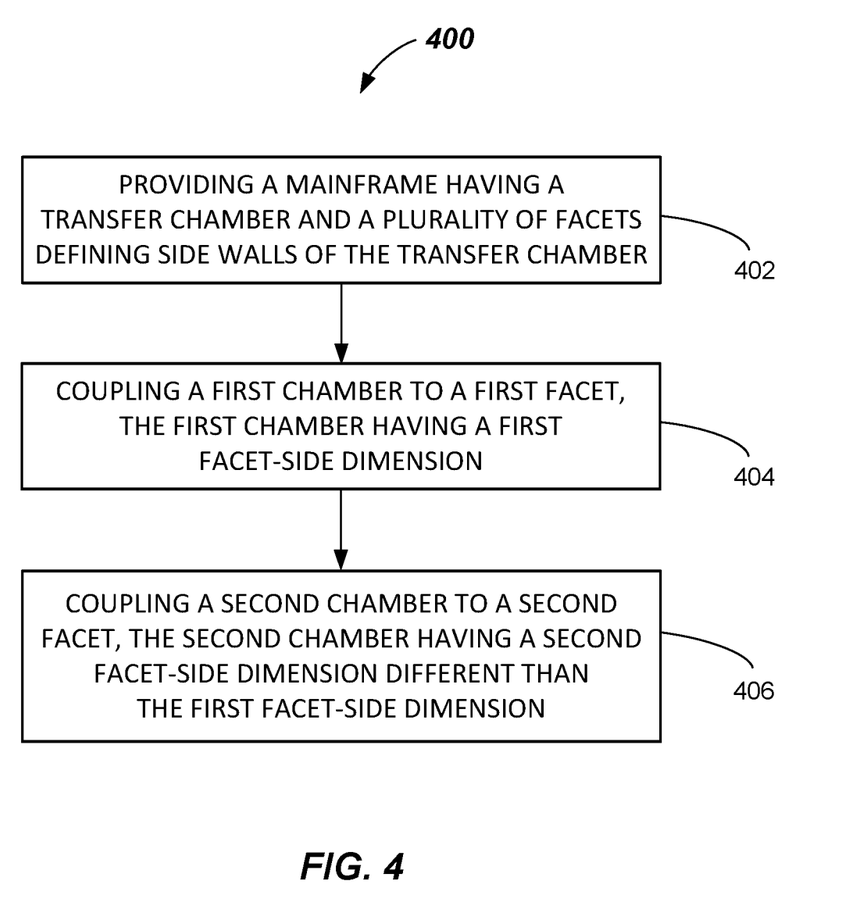
FIG. 4 illustrates a flowchart of a method of assembling an electronic device manufacturing system according to embodiments.

FIG. 4 illustrates a method 400 of assembling an electronic device manufacturing system in accordance with one or more embodiments. At process block 402, method 400 may include providing a mainframe having a transfer chamber and a plurality of facets that define side walls of the transfer chamber. For example, the mainframe may be mainframe 202 of FIG. 2 having facets 204a-d that define the side walls of transfer chamber 206.

At process block 404, a first chamber may be coupled to a first facet of the mainframe. The first chamber may have a first facet-side dimension. The first facet-side dimension may be, e.g., a facet-side width of the chamber or a width of a substrate access port for the first chamber. In some embodiments, the first chamber may be, e.g., a process chamber 210 coupled to facet 204a, and the first facet-side dimension may be width W204a of process chamber 210 or width W305a of substrate access port 205a.

At process block 406, method 400 may include coupling a second chamber to a second facet of the mainframe. The second chamber may have a second facet-side dimension different than the first facet-side dimension. The second facet-side dimension may be, e.g., a facet-side width of the chamber or a width of a substrate access port for the second chamber. In some embodiments, the second chamber may be, e.g., process chamber 212 coupled to facet 204c, and the second facet-side dimension may be width W204c of process chamber 212 or width W305c of substrate access port 205c.

The above process blocks of method 400 may be executed or performed in an order or sequence not limited to the order and sequence shown and described. For example, in some embodiments, process block 404 may be performed after or simultaneously with process block 406.

Persons skilled in the art should readily appreciate that the embodiments of the invention described herein is susceptible of broad utility and application. Many embodiments and adaptations of the invention other than those described herein, as well as many variations, modifications, and equivalent arrangements, will be apparent from, or reasonably suggested by, the invention and the foregoing description thereof, without departing from the substance or scope of the invention. For example, although an example mixed-platform electronic device manufacturing system is shown in FIG. 2, other suitable configurations of mixed-platform process and load lock chambers may be used in electronic device manufacturing systems in accordance with one or more embodiments of the invention. Accordingly, while the invention has been described herein in detail in relation to specific embodiments, it should be understood that this disclosure is only illustrative and presents examples of the invention and is made merely for purposes of providing a full and enabling disclosure of the invention. This disclosure is not intended to limit the invention to the particular apparatus, devices, assemblies, systems, or methods disclosed, but, to the contrary, the intention is to cover all modifications, equivalents, and alternatives falling within the scope of the invention.

What is claimed is:

1. An electronic device manufacturing system, comprising:
   a mainframe including a transfer chamber and a plurality of facets defining side walls of the transfer chamber, wherein:
      the mainframe is configured to couple to a plurality of process chambers and to one or more load lock chambers;
      the plurality of process chambers comprises a first number of process chambers and a second number of process chambers;
      each of the plurality of facets is configured to couple to one or more corresponding process chambers of the plurality of process chambers or to the one or more load lock chambers;
      a first one of the plurality of facets has the first number of process chambers directly coupled thereto;
      a second one of the plurality of facets has the second number of process chambers directly coupled thereto, wherein the second number of process chambers is different than the first number of process chambers; and
      one of the plurality of facets has the one or more load lock chambers coupled thereto.

2. The electronic device manufacturing system of claim 1, wherein at least one of the one or more load lock chambers is a stacked load lock chamber.

3. The electronic device manufacturing system of claim 1, wherein the one or more load lock chambers comprises a triple-stacked load lock chamber.

4. The electronic device manufacturing system of claim 1, wherein the one or more load lock chambers comprises a process-capable load lock chamber.

5. The electronic device manufacturing system of claim 1, wherein each load lock chamber of the one or more load lock chambers is a batch-type load lock chamber, a single substrate-type load lock chamber, or a combination thereof.

6. The electronic device manufacturing system of claim 1, wherein a third one of the plurality of facets has a third number of process chambers attached thereto, and wherein the third number of process chambers is different than the first number of process chambers and is different than the second number of process chambers.

7. The electronic device manufacturing system of claim 1, wherein a first process chamber that is coupled to the first one of the plurality of facets has a first facet-side dimension, and a second process chamber that is coupled to the second one of the plurality of facets has a second facet-side dimension, wherein the second facet-side dimension is different than the first facet-side dimension.

8. The electronic device manufacturing system of claim 7, wherein a third process chamber that is coupled to a third one of the plurality of facets has a third facet-side dimension, wherein the third facet-side dimension is different than the first facet-side dimension and is different than the second facet-side dimension.

9. The electronic device manufacturing system of claim 7, wherein a fourth process chamber and a fifth process chamber are coupled to the first one of the plurality of facets, wherein the fourth process chamber and the fifth process chamber each has a corresponding facet-side dimension that is substantially equal to the first facet-side dimension of the first process chamber.

10. The electronic device manufacturing system of claim 7, wherein a sixth process chamber is coupled to the second one of the plurality of facets, wherein the sixth process chamber has a sixth facet-side dimension that is substantially equal to the second facet-side dimension of the second process chamber.

11. The electronic device manufacturing system of claim 1, wherein the one or more load lock chambers comprises a triple-stacked load lock chamber, wherein at least one load lock chamber of the triple-stacked load lock chamber is a process-capable load lock chamber.

12. The electronic device manufacturing system of claim 1, wherein the one or more load lock chambers comprises a triple-stacked load lock chamber, wherein the triple-stacked load lock chamber has a top substrate volume, a middle substrate volume, and a bottom substrate volume, and wherein the top substrate volume is process-capable.

13. The electronic device manufacturing system of claim 1, wherein each of the plurality of facets has one or more corresponding substrate access ports, wherein a first substrate access port of the first one of the plurality of facets has a first size and a second substrate access port of the second one of the plurality of facets has a second size, wherein the second size is different than the first size.

14. An electronic device manufacturing system, comprising:
   a mainframe including a transfer chamber and a plurality of facets defining side walls of the transfer chamber, wherein:
      the mainframe is configured to couple to a plurality of process chambers and to one or more load lock chambers;
      each of the plurality of process chamber is configured to perform a corresponding process of substrate processing;
      the plurality of process chambers comprises a first number of process chambers and a second number of process chambers;
      each of the plurality of facets is configured to couple to one or more corresponding process chambers of the plurality of process chambers or to the one or more load lock chambers;
      a first one of the plurality of facets has the first number of process chambers coupled thereto;
      a second one of the plurality of facets has the second number of process chambers coupled thereto, wherein the second number of process chambers is different than the first number of process chambers; and
      one of the plurality of facets has the one or more load lock chambers coupled thereto.

15. The electronic device manufacturing system of claim 14, wherein the corresponding process comprises one or more of deposition, oxidation, nitration, etching, polishing, cleaning, or lithography.

16. The electronic device manufacturing system of claim 14, wherein one or more substrates are to be transferred between at least one of the one or more load lock chambers and a substrate holding enclosure via a factory interface.

17. The electronic device manufacturing system of claim 14, wherein the first number of process chambers are opposite the one or more load lock chambers around the transfer chamber, and wherein the second number of process chambers are not opposite the first number of process chambers.

18. The electronic device manufacturing system of claim 17, wherein one or more substrates are to be transferred between at least one of the one or more load lock chambers and a substrate holding enclosure via a factory interface.

19. The electronic device manufacturing system of claim 17, wherein the first number of process chambers are opposite the one or more load lock chambers around the transfer chamber, and wherein the second number of process chambers are not opposite the first number of process chambers.

20. An electronic device manufacturing system, comprising:
   a mainframe including a transfer chamber and a plurality of facets defining side walls of the transfer chamber, wherein:
      the mainframe is configured to couple to a plurality of process chambers and to one or more load lock chambers;
      the plurality of process chambers comprises a first number of process chambers and a second number of process chambers;
      the transfer chamber is disposed between the first number of process chambers and the one or more load lock chambers;
      the transfer chamber is disposed between the second number of process chambers and the one or more load lock chambers;
   each of the plurality of facets is configured to couple to one or more corresponding process chambers of the plurality of process chambers or to the one or more load lock chambers;
   a first one of the plurality of facets has the first number of process chambers coupled thereto;
   a second one of the plurality of facets has the second number of process chambers coupled thereto, wherein the second number of process chambers is different than the first number of process chambers; and
   one of the plurality of facets has the one or more load lock chambers coupled thereto.

* * * * *